(12) United States Patent
Ashimine et al.

(10) Patent No.: US 11,605,503 B2
(45) Date of Patent: Mar. 14, 2023

(54) FRONT AND BACK ELECTRODE TRENCH CAPACITOR

(71) Applicant: Murata Manufacturing Co., Ltd., Nagaokakyo (JP)

(72) Inventors: Tomoyuki Ashimine, Nagaokakyo (JP); Hiroshi Nakagawa, Nagaokakyo (JP); Yasuhiro Murase, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 435 days.

(21) Appl. No.: 16/781,459

(22) Filed: Feb. 4, 2020

(65) Prior Publication Data

US 2020/0176614 A1 Jun. 4, 2020

Related U.S. Application Data

(63) Continuation of application No. PCT/JP2018/041805, filed on Nov. 12, 2018.

(30) Foreign Application Priority Data

Nov. 30, 2017 (JP) .............................. JP2017-229930

(51) Int. Cl.
 *H01G 4/10* (2006.01)
 *H01G 4/008* (2006.01)

(52) U.S. Cl.
 CPC ............... *H01G 4/10* (2013.01); *H01G 4/008* (2013.01)

(58) Field of Classification Search
 CPC combination set(s) only.
 See application file for complete search history.

(56) References Cited

U.S. PATENT DOCUMENTS

| 6,532,143 | B2 * | 3/2003 | Figueroa | H01G 4/30 |
| | | | | 361/306.3 |
| 6,597,562 | B1 * | 7/2003 | Hu | H01L 28/82 |
| | | | | 257/532 |
| 2005/0208728 | A1 * | 9/2005 | Benetik | H01L 23/5222 |
| | | | | 438/393 |

(Continued)

FOREIGN PATENT DOCUMENTS

| CN | 102376780 A | * | 3/2012 |
| EP | 0046868 A2 | * | 3/1982 |

(Continued)

OTHER PUBLICATIONS

International Search Report Issued for PCT/JP2018/041805, dated Jan. 15, 2019.

(Continued)

*Primary Examiner* — David M Sinclair
(74) *Attorney, Agent, or Firm* — ArentFox Schiff LLP

(57) ABSTRACT

A capacitor that includes an insulating base material having a first main surface and a second main surface facing each other, the insulating base material defining first and second trenches extending from the first main surface into the base material such that first trench and the second trench overlap each other; a first conductor in the first trench; a first external electrode on the first main surface of the base material and connected to the first conductor; a second conductor in the second trench; and a second external electrode on the second main surface of the base material and connected to the second conductor.

10 Claims, 6 Drawing Sheets

(56) References Cited

U.S. PATENT DOCUMENTS

| | | |
|---|---|---|
| 2007/0205486 A1 | 9/2007 | Shioga et al. |
| 2008/0291603 A1 | 11/2008 | Matters-Kammerer |
| 2010/0087042 A1 | 4/2010 | Kim et al. |
| 2011/0013340 A1* | 1/2011 | Horiuchi ................ H05K 1/162 |
| | | 361/311 |
| 2012/0181658 A1 | 7/2012 | Mohammed et al. |
| 2012/0212877 A1* | 8/2012 | Lu ......................... H01G 5/011 |
| | | 361/301.4 |
| 2013/0148259 A1 | 6/2013 | Masuda et al. |
| 2015/0145104 A1 | 5/2015 | Bauer et al. |
| 2015/0213958 A1 | 7/2015 | Nakashima et al. |
| 2016/0055977 A1 | 2/2016 | Nakashima et al. |
| 2017/0358395 A1* | 12/2017 | Ahn ........................ H01G 9/07 |

FOREIGN PATENT DOCUMENTS

| | | | |
|---|---|---|---|
| JP | 2007234843 A | 9/2007 | |
| JP | 2008153618 A | 7/2008 | |
| JP | 2009059990 A | 3/2009 | |
| JP | 2009515356 A | 4/2009 | |
| JP | 2009135310 A | 6/2009 | |
| JP | 5416840 B2 | 2/2014 | |
| JP | 2014505354 A | 2/2014 | |
| JP | 2015111671 A | 6/2015 | |
| JP | 2015138933 A | 7/2015 | |

OTHER PUBLICATIONS

Written Opinion of the International Searching Authority issued for PCT/JP2018/041805, dated Jan. 15, 2019.

\* cited by examiner

FRONT AND BACK ELECTRODE TRENCH CAPACITOR

CROSS REFERENCE TO RELATED APPLICATIONS

The present application is a continuation of International application No. PCT/JP2018/041805, filed Nov. 12, 2018, which claims priority to Japanese Patent Application No. 2017-229930, filed Nov. 30, 2017, the entire contents of each of which are incorporated herein by reference.

FIELD OF THE INVENTION

The present invention relates to a capacitor, and more particularly to a front and back electrode type trench capacitor.

BACKGROUND OF THE INVENTION

Conventionally, a capacitor that can be formed on a semiconductor substrate using a semiconductor process is well known (for example, Patent Document 1).

The capacitor of Patent Document 1, for example, is obtained by forming a plurality of recesses (so-called trenches) in a silicon substrate, oxidizing portions defining the plurality of recesses of the silicon substrate to form silicon oxide, and forming an anode and a cathode on one and another of the adjacent recesses, respectively. The capacitor having such a configuration is referred to as a trench capacitor in the present description.

Since the capacitor of Patent Document 1 can be formed using the semiconductor process, it is suitable for forming as one circuit element in a semiconductor integrated circuit. Further, since the trench can be miniaturized and shape-controlled with accuracy of the semiconductor process, it is suitable for improving capacitance density (capacitance per unit volume) and withstand voltage of the capacitor.

In the capacitor of Patent Document 1, both anode wiring and cathode wiring are taken out from the same main surface of the silicon substrate.

On the other hand, Patent Document 2 discloses a so-called front and back electrode type capacitor in which anode wiring and cathode wiring are respectively taken out from one main surface side and another main surface side facing each other of a substrate. The front and back electrode type capacitor is suitable for forming a composite element such as a CR snubber element in which a capacitor and a resistor are connected in series.

Patent Document 1: Japanese Patent Application Laid-Open No. 2009-59990

Patent Document 2: Japanese Patent No. 5416840

SUMMARY OF THE INVENTION

However, the capacitor of Patent Document 2 is obtained by providing a plurality of through holes in a valve metal base material by anodic oxidation and forming cylindrical electrodes in the through holes. Therefore, it is not easy to form the capacitor in a semiconductor integrated circuit by a semiconductor process.

Accordingly, an object of the present invention is to provide a front and back electrode type trench capacitor that can be easily formed using a semiconductor process.

In order to achieve the above object, a capacitor according to an aspect of the present invention includes: an insulating base material having a first main surface and a second main surface facing each other, the insulating base material defining a bottomed first trench that extends into the insulating base material from the first main surface of the insulating base material and defining a bottomed second trench that extends into the insulating base material from the second main surface of the insulating base material, the bottomed first trench and the bottomed second trench overlapping each other; a first conductor in the first trench; a first external electrode on the first main surface of the base material and connected to the first conductor; a second conductor in the second trench; and a second external electrode on the second main surface of the base material and connected to the second conductor.

In addition, a capacitor according to another aspect of the present invention includes: an insulating base material having a first main surface and a second main surface facing each other, the insulating base material defining a bottomed first trench that extends into the insulating base material from the first main surface of the insulating base material and defining a second trench that extends from the first main surface to the second main surface so as to penetrate the insulating base material, the bottomed first trench and the second trench overlapping each other; a first conductor in the first trench; a first external electrode on the first main surface of the base material and connected to the first conductor; a second conductor in the second trench; and a second external electrode on the second main surface of the base material and connected to the second conductor.

The capacitors configured as described above can be formed by a semiconductor process using, for example, silicon oxide as a base material. Thereby, the trenches can be miniaturized and shape-controlled with accuracy of the semiconductor process, so that capacitance density and withstand voltage of the capacitor can be improved. Further, since the capacitors are configured as a front and back electrode type trench capacitors, it is suitable for forming a front and back electrode type composite element including the trench capacitor.

The capacitor may further include a conductor base material having a resistance component between the second trench and the second external electrode. According to this configuration, a front and back electrode type trench capacitor that functions as a CR snubber element is obtained by the conductor base material having the resistance component.

Further, the first trench and the second trench may be groove-shaped, and may face each other on surfaces including a groove longitudinal direction. According to this configuration, since the groove-shaped first and second trenches face each other on the surfaces including the groove longitudinal direction, a capacitance developing part can be formed having a large area, and a capacitor with large capacitance density can be obtained.

According to the capacitor of the present invention, a front and back electrode type trench capacitor that can be easily formed using a semiconductor process is obtained.

DETAILED DESCRIPTION OF THE INVENTION

Hereinafter, embodiments of the present invention will be described in detail with reference to the drawings. It should be noted that each of the embodiments described below shows a comprehensive or specific example. Numerical values, shapes, materials, components, arrangement and connection forms of components, steps and order of steps, and the like shown in the following embodiments are merely examples, and are not intended to limit the present invention.

First Embodiment

A capacitor according to a first embodiment is a front and back electrode type trench capacitor that can be easily formed using a semiconductor process.

(Structure of Capacitor)

Figure 1:
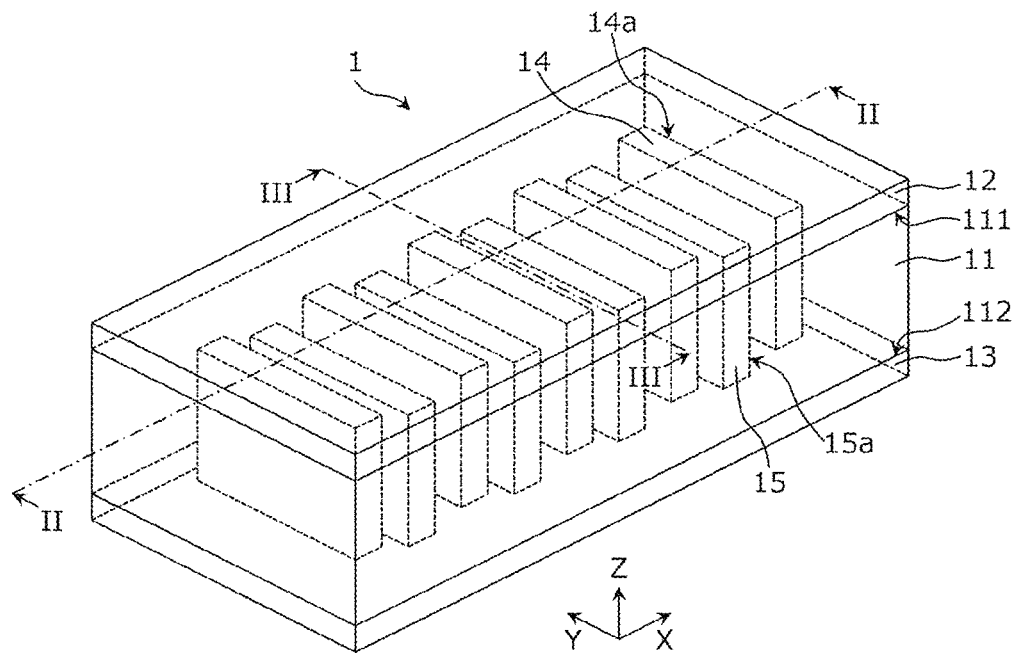
FIG. 1 is a perspective view showing an example of a structure of a capacitor according to a first embodiment.
Figure 2:
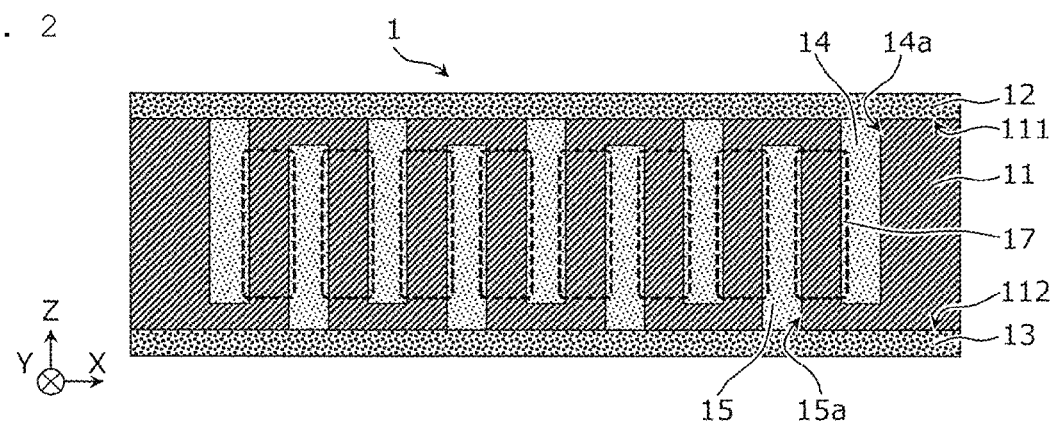
FIG. 2 is a front view showing the example of the structure of the capacitor according to the first embodiment.
Figure 3:
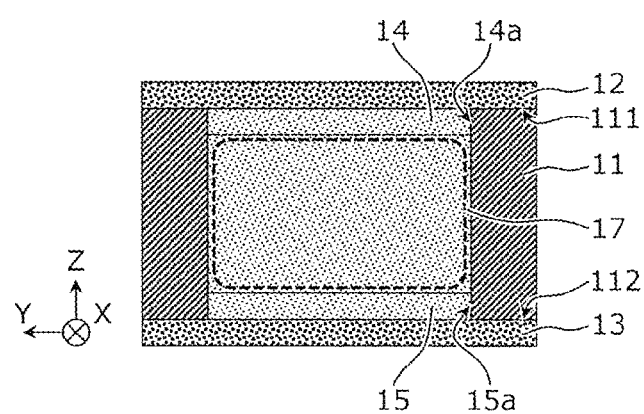
FIG. 3 is a side view showing the example of the structure of the capacitor according to the first embodiment.

FIGS. 1, 2, and 3 are a perspective view, a front view, and a side view, respectively, showing an example of a structure of the capacitor according to the first embodiment. FIG. 2 corresponds to a cross section of a cutting plane including a II-II cutting line of FIG. 1 as viewed in a direction of arrows, and FIG. 3 corresponds to a cross section of a cutting plane including a III-III cutting line of FIG. 1 as viewed in a direction of arrows.

As shown in FIGS. 1, 2, and 3, a capacitor 1 includes a base material 11, a first external electrode 12, a second external electrode 13, a first trench 14a, a first conductor 14, a second trench 15a, and a second conductor 15.

The base material 11 is made of an insulator, and has a first main surface 111 and a second main surface 112 facing each other. As a non-limiting example, the base material 11 may be formed of silicon oxide having a thickness of 50 μm.

The first external electrode 12 is formed on the first main surface 111 of the base material 11. The second external electrode 13 is formed on the second main surface 112 of the base material 11. The first external electrode 12 and the second external electrode 13 may be formed of aluminum as a non-limiting example.

The first trench 14a is a bottomed recess (that is, shallower than the thickness of the base material 11) and extends into the base material 11 from the first main surface 111 of the base material 11. The second trench 15a is a bottomed recess (that is, shallower than the thickness of the base material 11) and extends into the base material 11 from the second main surface 112 of the base material 11. As a non-limiting example, the first trench 14a and the second trench 15a are rectangular grooves having the longest side extending in a Y direction in a top view of the capacitor 1, and may have a depth of 30 μm. Note that the depths of the first trench 14a and the second trench 15a in FIGS. 1 to 4 are exaggerated for purposes of illustration.

The first trench 14a and the second trench 15a face each other on surfaces (for example, YZ surfaces) including a longitudinal direction (the Y direction). In other words, they overlap each other in a plane parallel to the Y and Z directions.

The first conductor 14 is formed in the first trench 14a and connected to the first external electrode 12. The second conductor 15 is formed in the second trench 15a and connected to the second external electrode 13. The first conductor 14 and the second conductor 15 may be formed of polysilicon as an example.

A capacitance developing part 17 is formed by the first conductor 14, the second conductor 15, and a portion of the base material 11 sandwiched between the first conductor 14 and the second conductor 15.

(Method for Manufacturing Capacitor)

Next, an example of a method for manufacturing the capacitor 1 will be described.

Figure 4:
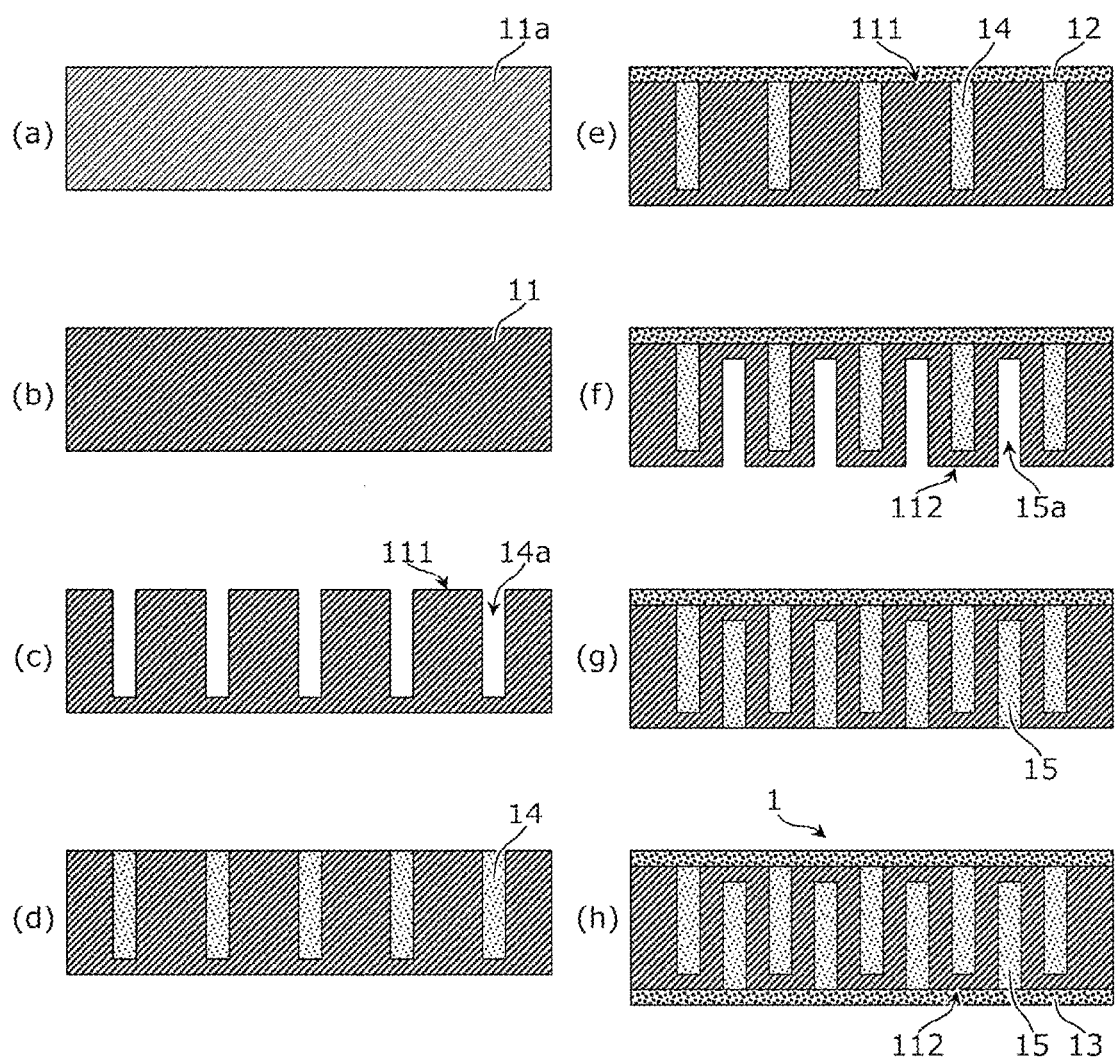
FIG. 4 is a process diagram showing an example of a method for manufacturing the capacitor according to the first embodiment.

FIG. 4 is a process diagram showing the example of the method for manufacturing the capacitor 1.

A silicon substrate 11a having a thickness of 50 μm is prepared (step a). The silicon substrate 11a is oxidized by thermal oxidation treatment at a temperature of 1000° C. in an oxygen atmosphere to obtain a base material 11 made of silicon oxide (step b).

A groove-shaped first trench 14a having a depth of 30 μm is formed so as to extend from a first main surface 111 of the base material 11 into the base material 11 by lithography and dry etching (step c).

A first conductor 14 is formed by filling the first trench 14a with polysilicon by CVD (Chemical Vapor Deposition) treatment (step d).

An aluminum electrode is formed on the first main surface 111 of the base material 11 and the first conductor 14 to form a first external electrode 12 (step e).

A groove-shaped second trench 15a having a depth of 30 μm is formed so as to extend from a second main surface 112 of the base material 11 into the base material 11 by lithography and dry etching (step f).

Polysilicon is filled in the second trench 15a by CVD treatment, and a second conductor 15 is formed by CMP treatment (step g).

An aluminum electrode is formed on the second main surface 112 of the base material 11 and the second conductor 15 to form a second external electrode 13 (step h).

Thus, the capacitor 1 is formed as a front and back electrode type trench capacitor by a semiconductor process using, for example, the silicon substrate 11a. Note that a plurality of capacitors 1 may be formed on the silicon substrate 11a and separated into pieces by cutting with a dicing machine.

In the capacitor 1, the first trench 14a and the second trench 15a can be miniaturized and shape-controlled with accuracy of the semiconductor process, so that capacitance density and withstand voltage can be improved. Further, since the capacitor 1 is configured as the front and back electrode type trench capacitor, it is suitable for configuring a front and back electrode type composite element including the trench capacitor. A specific example of the composite element will be described later.

Further, in the capacitor 1, the groove-shaped first trench 14a and second trench 15a have surfaces that face each other along the longitudinal direction of the grooves. Therefore, for example, compared with a case where a trench is formed in a cylindrical shape, the capacitance developing part can be formed to have a large area, and a capacitor having large capacitance density can be obtained.

Second Embodiment

A capacitor according to a second embodiment is a front and back electrode type trench capacitor that can be easily formed using a semiconductor process.

(Structure of Capacitor)

Figure 5:
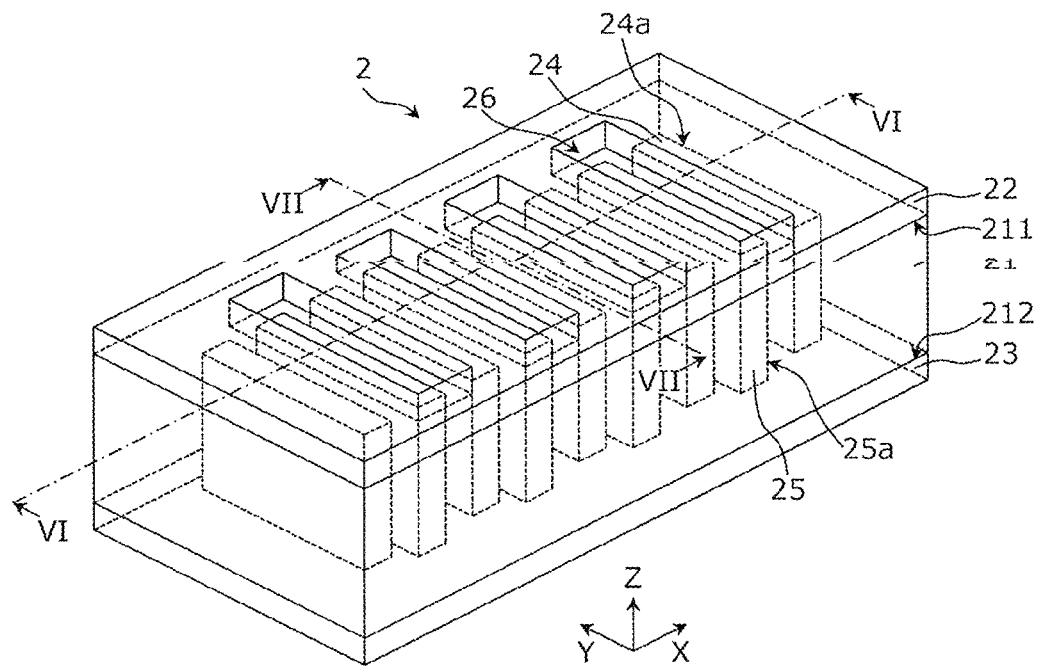
FIG. 5 is a perspective view showing an example of a structure of a capacitor according to a second embodiment.
Figure 6:
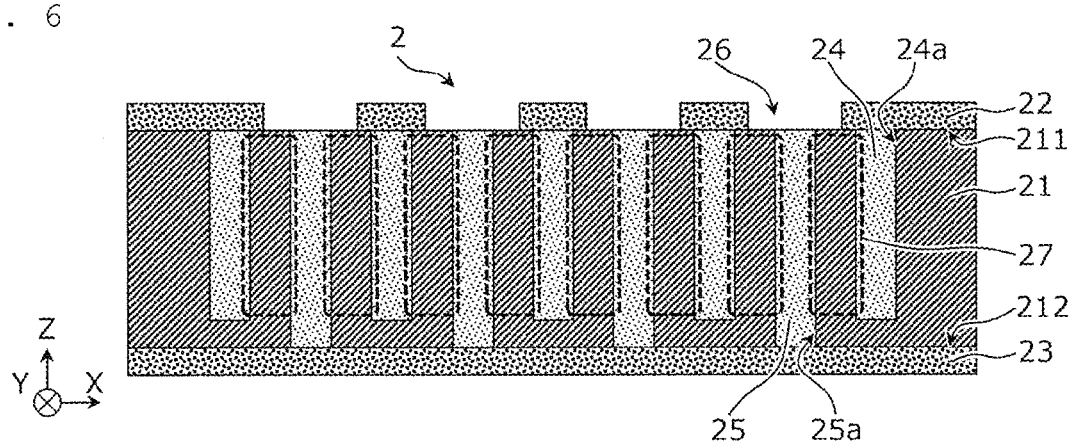
FIG. 6 is a front view showing the example of the structure of the capacitor according to the second embodiment.
Figure 7:
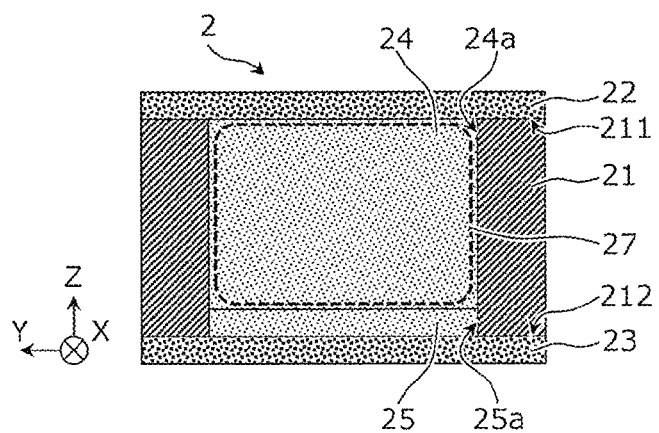
FIG. 7 is a side view showing the example of the structure of the capacitor according to the second embodiment.

FIGS. 5, 6, and 7 are a perspective view, a front view, and a side view, respectively, showing an example of a structure of the capacitor according to the second embodiment. FIG. 6 corresponds to a cross section of a cutting plane including a VI-VI cutting line of FIG. 5 as viewed in a direction of arrows, and FIG. 7 corresponds to a cross section of a cutting plane including a VII-VII cutting line of FIG. 5 as viewed in a direction of arrows.

As shown in FIGS. 5, 6, and 7, a capacitor 2 includes a base material 21, a first external electrode 22, a second external electrode 23, a first trench 24a, a first conductor 24, a second trench 25a, and a second conductor 25.

The base material 21 is made of an insulator, and has a first main surface 211 and a second main surface 212 that face each other. As a non-limiting example, the base material 21 may be formed of silicon oxide having a thickness of 50 μm.

The first external electrode 22 is formed on the first main surface 211 of the base material 21. A cavity 26 is formed in a portion of the first external electrode 22 that overlaps the second conductor 25 in a top view. The second external electrode 23 is formed on the second main surface 212 of the base material 21. The first external electrode 22 and the second external electrode 23 may be formed of aluminum as a non-limiting example.

The first trench 24a is a bottomed recess (that is, shallower than the thickness of the base material 21) and extends into the base material 21 from the first main surface 211 of the base material 21. The second trench 25a is a through hole that penetrates the base material 21. As a non-limiting example, the first trench 24a and the second trench 25a are a rectangular groove and a through hole, respectively, which have their longest sides extending in a Y direction in a top view of the capacitor 2, and depth of the first trench 24a may be 30 μm. Note that the depth of the first trench 24a in FIGS. 5 to 8 is exaggerated for purposes of illustration.

The first trench 24a and the second trench 25a face each other on surfaces (for example, YZ surfaces) including a longitudinal direction (the Y direction). In other words, they overlap each other in a plane parallel to the Y and Z directions.

The first conductor 24 is formed in the first trench 24a and connected to the first external electrode 22. The second conductor 25 is formed in the second trench 25a and connected to the second external electrode 23. The second conductor 25 is not connected to the first external electrode 22 because of the cavity 26 provided in the first external electrode 22. The first conductor 24 and the second conductor 25 may be formed of polysilicon as an example.

A capacitance developing part 27 is formed by the first conductor 24, the second conductor 25, and a portion of the base material 21 sandwiched between the first conductor 24 and the second conductor 25.

(Method for Manufacturing Capacitor)

Next, an example of a method for manufacturing the capacitor 2 will be described.

Figure 8:
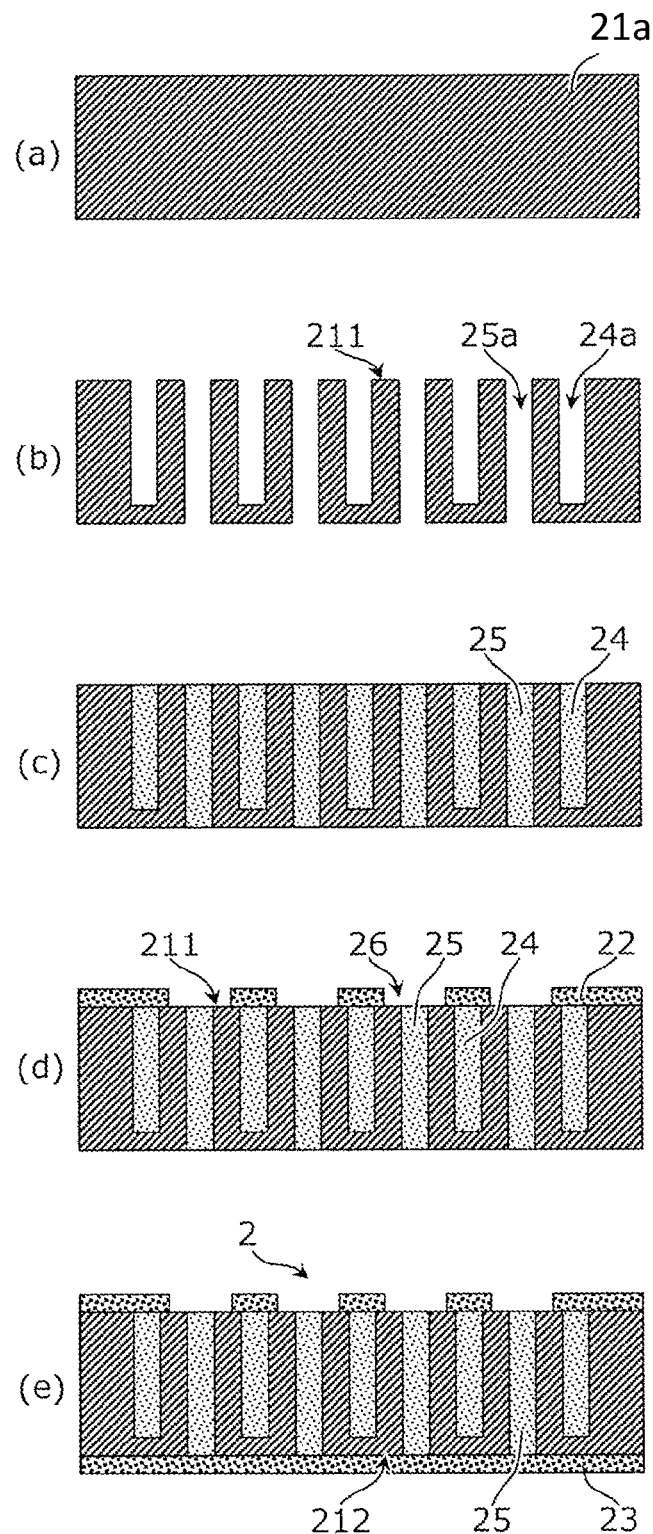
FIG. 8 is a process diagram showing an example of a method for manufacturing the capacitor according to the second embodiment.

FIG. 8 is a process diagram showing the example of the method for manufacturing the capacitor 2.

A silicon substrate 21a having a thickness of 50 μm is prepared. The silicon substrate 21a is oxidized by thermal oxidation treatment at a temperature of 1000° C. in an oxygen atmosphere to obtain a base material 21 made of silicon oxide (step a).

By lithography and dry etching, a groove-shaped first trench 24a having a depth of 30 μm and a second trench 25a that is a through hole penetrating the base material 21 are formed so as to extend from a first main surface 211 of the base material 21 (step b).

A first conductor 24 and a second conductor 25 are formed by filling the first trench 24a and the second trench 25a with polysilicon by CVD (Chemical Vapor Deposition) treatment (step c).

An aluminum electrode is formed on the first main surface 211 of the base material 21, the first conductor 24, and the second conductor 25. A portion of the aluminum electrode that overlaps the second conductor 25 when viewed from above is removed by lithography and etching to form a cavity 26, thereby forming a first external electrode 22 (step d).

An aluminum electrode is formed on a second main surface 212 of the base material 21 and the second conductor 25 to form a second external electrode 23 (step e).

Thus, the capacitor 2 is formed as a front and back electrode type trench capacitor by a semiconductor process using, for example, the silicon substrate 21a. Note that a plurality of capacitors 2 may be formed on the silicon substrate 21a and separated into pieces by cutting with a dicing machine.

In the capacitor 2, the first trench 24a and the second trench 25a can be miniaturized and shape-controlled with accuracy of the semiconductor process, so that capacitance density and withstand voltage can be improved. Further, since the capacitor 2 is configured as the front and back electrode type trench capacitor, it is suitable for forming a front and back electrode type composite element including the trench capacitor. A specific example of the composite element will be described later.

Further, in the capacitor 2, the groove-shaped first trench 24a and second trench 25a face each other on the surfaces including the groove longitudinal direction. Therefore, for example, compared with a case where a trench is formed in a cylindrical shape, the capacitance developing part can be formed in a large area, and a capacitor having large capacitance density can be obtained.

Third Embodiment

A composite element according to a third embodiment is a front and back electrode type composite element including a trench capacitor that can be easily formed using a semiconductor process. In the third embodiment, such a composite element will be described with an example of a CR snubber element.

(Structure of Composite Element)

Figure 9:
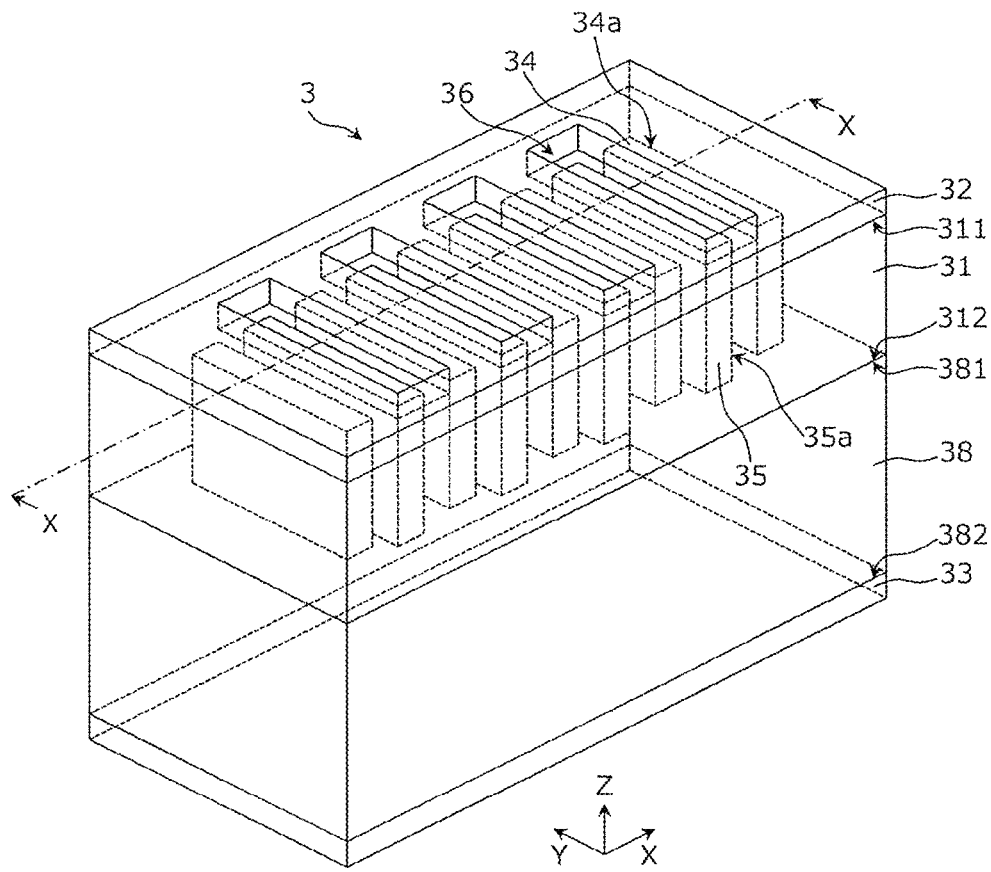
FIG. 9 is a perspective view showing an example of a structure of a capacitor according to a third embodiment.
Figure 10:
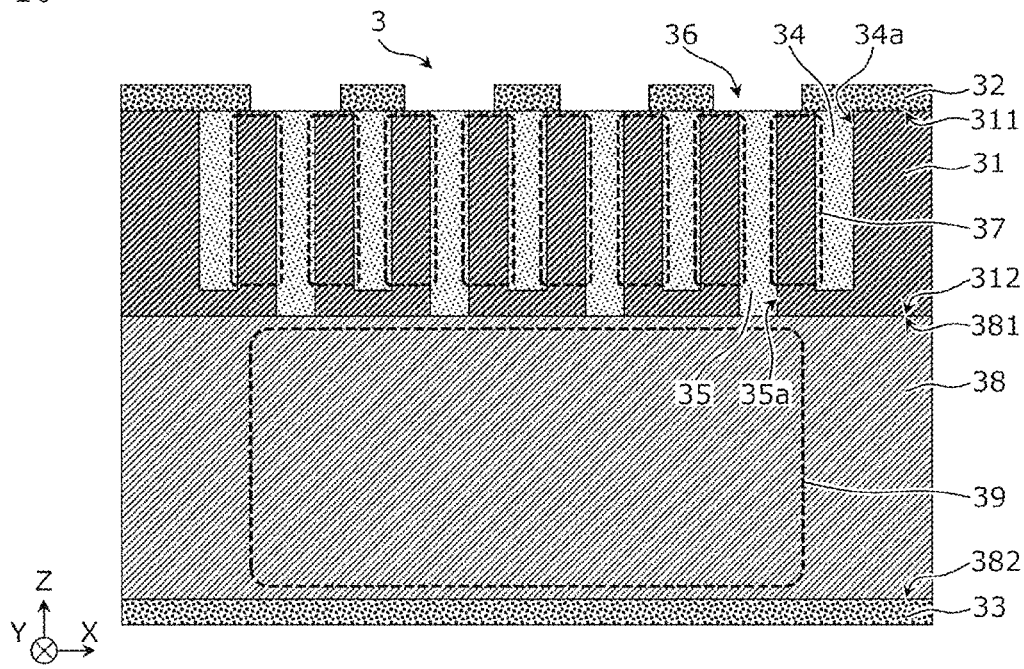
FIG. 10 is a front view showing the example of the structure of the capacitor according to the third embodiment.

FIGS. 9 and 10 are a perspective view and a front view, respectively, showing an example of a structure of the composite element according to the third embodiment. FIG. 10 corresponds to a cross section of a cutting plane including an X-X cutting line of FIG. 9 as viewed in a direction of arrows.

As shown in FIGS. 9 and 10, a composite element 3 includes an insulating base material 31, a first external electrode 32, a second external electrode 33, a first trench 34a, a first conductor 34, a second trench 35a, a second conductor 35, and a conductor base material 38.

The insulating base material 31 is made of an insulator, and has a first main surface 311 and a second main surface 312 facing each other. As a non-limiting example, the insulating base material 31 may be formed of silicon oxide having a thickness of 50 µm.

The conductor base material 38 is a conductive part having a resistance component formed between the second trench 35a and the second external electrode 33. As a non-limiting example, the conductor base material 38 may be formed of low resistance silicon having a resistivity of about $1.0 \times 10^1$ Ωcm. The conductor base material 38 has a first main surface 381 and a second main surface 382 facing each other. The first main surface 381 may be formed in contact with the second main surface 312 of the insulating base material 31.

The first external electrode 32 is formed on the first main surface 311 of the insulating base material 31. A cavity 36 is formed in a portion of the first external electrode 32 that overlaps the second conductor 35 in a top view. The second external electrode 33 is formed on the second main surface 312 side of the insulating base material 31 with the conductor base material 38 interposed therebetween. The first external electrode 32 and the second external electrode 33 may be formed of aluminum as a non-limiting example.

Figure 11:
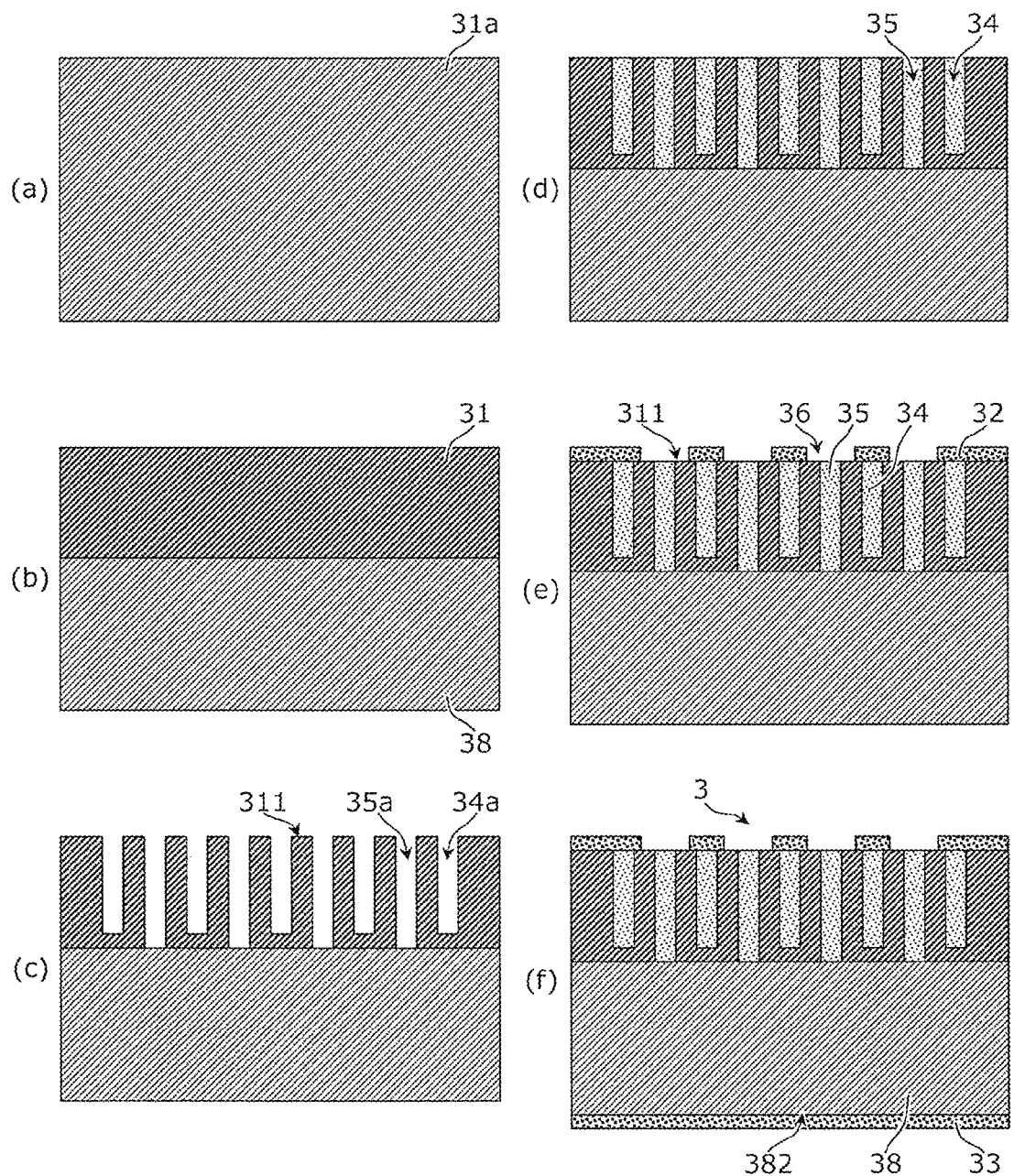
FIG. 11 is a process diagram showing an example of a method for manufacturing the capacitor according to the third embodiment.

The first trench 34a is a bottomed recess (that is, shallower than the thickness of the insulating base material 31) and extends into the base material 31 from the first main surface 311 of the insulating base material 31. The second trench 35a is a recess that penetrates the insulating base material 31 and has a bottom reaching the conductor base material 38. As a non-limiting example, the first trench 34a and the second trench 35a are a rectangular groove and a through hole, respectively, which have their longest sides extending in a Y direction in a top view of the composite element 3, and depth of the first trench 34a may be 30 µm. Depth of the second trench 35a is equal to or greater than the thickness of the insulating base material 31, and is shallower than combined thickness of the insulating base material 31 and the conductor base material 38. Note that the depth of the first trench 34a in FIGS. 9 to 11 is exaggerated for purposes of illustration.

The first trench 34a and the second trench 35a face each other on surfaces (for example, YZ surfaces) including a longitudinal direction (the Y direction). In other words, they overlap each other in a plane parallel to the Y and Z directions.

The first conductor 34 is formed in the first trench 34a and connected to the first external electrode 32. The second conductor 35 is formed in the second trench 35a and connected to the second external electrode 33 with the conductor base material 38 interposed therebetween. The second conductor 35 is not connected to the first external electrode 32 because of the cavity 36 provided in the first external electrode 32. The first conductor 34 and the second conductor 35 may be formed of polysilicon as an example.

A capacitance developing part 37 is formed by the first conductor 34, the second conductor 35, and a portion of the insulating base material 31 sandwiched between the first conductor 34 and the second conductor 35. In addition, a resistance developing part 39 is formed by a portion of the conductor base material 38 sandwiched between the second conductor 35 and the second external electrode 33.

(Method for Manufacturing Composite Element)

Next, an example of a method for manufacturing the composite element 3 will be described.

FIG. 11 is a process diagram showing the example of the method for manufacturing the composite element 3.

A silicon substrate 31a having a thickness of 625 µm is prepared (step a). The silicon substrate 31a is made of, for example, low resistance silicon having a resistivity of about $1.0 \times 10^1$ Ωcm. The silicon substrate 31a is oxidized to a depth of 50 µm from one main surface side by thermal oxidation treatment at a temperature of 1000° C. in an oxygen atmosphere, and an oxidized portion is used as an insulating base material 31 made of silicon oxide. A non-oxidized portion on another main surface side of the silicon substrate 31a becomes a conductor base material 38 (step b).

By lithography and dry etching, a groove-shaped first trench 34a having a depth of 30 µm and a groove-shaped second trench 35a that penetrates the insulating base material 31 (that is, depth is equal to or greater than thickness of the insulating base material 31 and is shallower than combined thickness of the insulating base material 31 and the conductor base material 38) are formed on a first main surface 311 of the insulating base material 31 (step c). As an example, the depth of the second trench 35a may be 50 µm.

A first conductor 34 and a second conductor 35 are formed by filling the first trench 34a and the trench 35a with polysilicon by CVD (Chemical Vapor Deposition) treatment (step d).

An aluminum electrode is formed on the first main surface 311 of the insulating base material 31, the first conductor 34, and the second conductor 35. A portion of the aluminum electrode that overlaps the second conductor 35 as viewed from above is removed by lithography and etching to form a cavity 36, thereby forming a first external electrode 32 (step e).

An aluminum electrode is formed on a second main surface 382 of the conductor base material 38 to form a second external electrode 33 (step f).

As described above, the composite element 3 is formed as a front and back electrode type composite element having a capacitor and a resistor connected in series by a semiconductor process using the silicon substrate 31a. Note that a plurality of composite elements 3 may be formed on the silicon substrate 31a and separated into pieces by cutting with a dicing machine.

In the composite element 3, the first trench 34a and the second trench 35a can be miniaturized and shape-controlled with accuracy of the semiconductor process, so that capacitance density and withstand voltage of the capacitor can be improved.

Further, in the composite element 3, the groove-shaped first trench 34a and second trench 35a face each other on the surfaces including the groove longitudinal direction. Therefore, for example, compared with a case where a trench is formed in a cylindrical shape, the capacitance developing part can be formed in a large area, and a capacitor having large capacitance density can be obtained.

In addition, since the composite element 3 can be easily formed using the semiconductor process, for example, in a semiconductor integrated circuit, the composite element 3 can be disposed as a CR snubber element in the immediate vicinity of a power semiconductor element. Thereby, an influence of an inductor component of wiring is reduced, and a more excellent ringing reduction effect can be obtained.

OTHER EMBODIMENTS, ETC

Although the capacitors and the composite element according to the embodiments of the present invention have been described above, the present invention is not limited to the individual embodiments. Unless deviating from the gist of the present invention, a form obtained by applying various modifications conceived by those skilled in the art to the present embodiments and a form constructed by combining components in different embodiments may be included within the scope of one or more embodiments of the present invention.

The present invention can be widely used in various electronic devices as a front and back electrode type trench capacitor that can be easily formed using a semiconductor process.

DESCRIPTION OF REFERENCE SYMBOLS 1, 2: Capacitor
3: Composite element
11, 21: Base material
11a, 21a, 31a: Silicon substrate
12, 22, 32: First external electrode
13, 23, 33: Second external electrode
14, 24, 34: First conductor
14a, 24a, 34a: First trench
15, 25, 35: Second conductor
15a, 25a, 35a: Second trench
17, 27, 37: Capacitance developing part
26, 36: Cavity
31: Insulating base material
38: Conductor base material
39: Resistance developing part
111, 211, 311, 381: First main surface
112, 212, 312, 382: Second main surface

The invention claimed is:

1. A capacitor comprising:
an insulating base material having a first main surface and a second main surface facing each other, the insulating base material defining a plurality of bottomed first trenches that extend into and terminate within the insulating base material from the first main surface of the insulating base material and defining a plurality of second trenches that extend from the first main surface to the second main surface so as to penetrate the insulating base material, the plurality of bottomed first trenches and the plurality of second trenches overlapping each other;
a plurality of first conductors each respectively in the plurality of bottomed first trenches, the plurality of first conductors having a first end at the first main surface of the insulating base material and a second bottom end that is not exposed at the second main surface of the insulating base material and the second bottom end is surrounded by the insulating base material;
a first external electrode on the first main surface of the base material and connected to the first end of each of the plurality of first conductors;
a plurality of second conductors each respectively in the plurality of second trenches; and
a second external electrode on the second main surface of the base material and connected to the plurality of second conductors.

2. The capacitor according to claim 1, further comprising a conductor base material having a resistance component between the plurality of second trenches and the second external electrode.

3. The capacitor according to claim 1, wherein the plurality of bottomed first trenches and the plurality of second trenches are groove-shaped, and have surfaces that face each other along a longitudinal direction of the plurality of bottomed first trenches and the plurality of second trenches.

4. The capacitor according to claim 3, wherein the plurality of bottomed first trenches and the plurality of second trenches are spaced from each other so as to form a capacitance developing part therebetween.

5. The capacitor according to claim 1, wherein the insulating base material comprises silicon oxide.

6. The capacitor according to claim 1, wherein the first external electrode and the second external electrode comprise aluminum.

7. The capacitor according to claim 1, wherein the plurality of bottomed first trenches and the plurality of second trenches are rectangular.

8. The capacitor according to claim 7, wherein the plurality of bottomed first trenches and the plurality of second trenches are spaced from each other so as to form a capacitance developing part therebetween.

9. The capacitor according to claim 1, wherein the first conductor and the second conductor comprise polysilicon.

10. The capacitor according to claim 1, wherein the plurality of bottomed first trenches and the plurality of second trenches are spaced from each other so as to form a capacitance developing part therebetween.

* * * * *